(12) United States Patent
Lee et al.

(10) Patent No.: US 11,424,729 B2
(45) Date of Patent: Aug. 23, 2022

(54) BULK-ACOUSTIC WAVE RESONATOR AND METHOD FOR MANUFACTURING THE SAME

(71) Applicant: Samsung Electro-Mechanics Co., Ltd., Suwon-si (KR)

(72) Inventors: Tae Hun Lee, Suwon-si (KR); Tae Yoon Kim, Suwon-si (KR); Moon Chul Lee, Suwon-si (KR); Chang Hyun Lim, Suwon-si (KR); Nam Jung Lee, Suwon-si (KR); Il Han Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 712 days.

(21) Appl. No.: 16/356,164

(22) Filed: Mar. 18, 2019

(65) Prior Publication Data

US 2020/0091888 A1    Mar. 19, 2020

(30) Foreign Application Priority Data

Sep. 18, 2018   (KR) ................. 10-2018-0111290

(51) Int. Cl.
*H03H 9/02*   (2006.01)
*H03H 9/17*   (2006.01)
*H03H 3/02*   (2006.01)

(52) U.S. Cl.
CPC .......... *H03H 9/02086* (2013.01); *H03H 3/02* (2013.01); *H03H 9/173* (2013.01); *H03H 9/174* (2013.01); *H03H 2003/021* (2013.01); *H03H 2003/023* (2013.01)

(58) Field of Classification Search
CPC .. H03H 9/173; H03H 9/174; H03H 2003/021; H03H 2003/023
See application file for complete search history.

(56) References Cited

U.S. PATENT DOCUMENTS

| 7,986,075 B2 | 7/2011 | Asai et al. | |
|---|---|---|---|
| 2007/0194863 A1* | 8/2007 | Shibata | H03H 3/02 333/187 |
| 2008/0024041 A1* | 1/2008 | Shibata | H03H 9/105 29/25.35 |
| 2009/0127978 A1* | 5/2009 | Asai | H03H 3/02 29/25.35 |
| 2016/0164489 A1* | 6/2016 | Shin | H03H 9/587 333/187 |
| 2018/0123554 A1* | 5/2018 | Kyoung | H03H 9/173 |

FOREIGN PATENT DOCUMENTS

| KR | 10-0306718 B1 | 12/2001 |
|---|---|---|
| KR | 10-2005-0072576 A | 7/2005 |

\* cited by examiner

*Primary Examiner* — Bryan P Gordon
(74) *Attorney, Agent, or Firm* — NSIP Law (57) ABSTRACT

A bulk-acoustic wave resonator includes a substrate, a first layer, a second layer, a membrane layer, and a resonance portion. The substrate includes a substrate protection layer. The first layer is disposed on the substrate protection layer. The second layer is disposed outside of the first layer. The membrane layer forms a cavity with the substrate protection layer and the first layer. The resonance portion is disposed on the membrane layer. Either one or both of the substrate protection layer and the membrane layer includes a protrusion disposed in the cavity.

10 Claims, 11 Drawing Sheets

BULK-ACOUSTIC WAVE RESONATOR AND METHOD FOR MANUFACTURING THE SAME

CROSS-REFERENCE TO RELATED APPLICATION

This application claims benefit under 35 USC 119(a) of priority to Korean Patent Application No. 10-2018-0111290 filed on Sep. 18, 2018 in the Korean Intellectual Property Office, the entire disclosure of which is incorporated herein by reference for all purposes.

BACKGROUND

1. Field

The present disclosure relates to a bulk-acoustic wave resonator, and a method for manufacturing the same.

2. Description of Related Art

A resonator refers to a device in which energy resonates at a specific frequency, and may mainly be used for filters, oscillators, frequency counters, and the like. Although there are various structures for resonance using such a resonator, recently, a resonance structure using an acoustic wave is very popular.

In recent years, a membrane type resonator, i.e., a structure in which an air gap (e.g., cavity) is formed in a position lower than a position of a resonance portion has been adopted.

On the other hand, when bonding occurs between the resonance portion, and the substrate disposed in a position lower than a position of the air gap, deterioration of mechanical and electrical characteristics may occur. There may be a problem that, at the time of manufacturing, the resonance portion, and the substrate disposed in a position lower than a position of the air gap may stick to each other, and may be deteriorated, relative to the normal frequency characteristic, and a noise may be generated.

As a result, it may be necessary to develop a structure capable of suppressing stiction between the resonance portion, and the substrate disposed in a position lower than a position of the air gap.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes a substrate, a first layer, a second layer, a membrane layer, and a resonance portion. The substrate includes a substrate protection layer. The first layer is disposed on the substrate protection layer. The second layer is disposed outside of the first layer. The membrane layer forms a cavity with the substrate protection layer and the first layer. The resonance portion is disposed on the membrane layer. Either one or both of the substrate protection layer and the membrane layer includes a protrusion disposed in the cavity.

The protrusion may include a first protrusion portion formed on the substrate protection layer, and a second protrusion portion formed on the membrane layer to be opposite to the first protrusion portion.

The protrusion may include a plurality of protrusions that are each disposed to be spaced apart from another.

The first layer may be formed of a material comprising an oxide or polysilicon.

Either one or both of the first layer and the second layer may be formed of any one selected from materials including an oxide or polysilicon.

The first layer may be formed of a material to be etched by any one selected from an etching solution or an etching gas containing hydrogen fluoride (HF), and an etching solution or an etching gas containing xenon difluoride ($XeF_2$).

The first layer and the second layer may be formed of a material to be selectively etched by any one selected from an etching solution or an etching gas containing hydrogen fluoride (HF), and an etching solution or an etching gas containing xenon difluoride ($XeF_2$).

The substrate protection layer and the membrane layer may be formed of a dielectric layer containing any one of silicon nitride ($Si_3N_4$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer containing any one of aluminum (Al), nickel (N), chromium (Cr), platinum (Pt), gallium (Ga), and hafnium (Hf).

The first layer may include a protrusion portion disposed inside of the cavity, and an etching prevention portion disposed to surround the cavity.

The bulk-acoustic wave resonator may further include a coating layer formed in the cavity.

In another general aspect, a method for manufacturing a bulk-acoustic wave resonator includes forming first and second sacrificial layers on a substrate, the first and second sacrificial layers being formed of materials to be etched by different etching solutions or etching gases, respectively, forming a membrane layer and a resonance portion above the first and second sacrificial layers, etching a portion of either one of the first and second sacrificial layers to form a column portion in a cavity, and etching the column portion.

The forming the first and second sacrificial layers on the substrate may include forming the second sacrificial layer having the column portion on the substrate and forming the first sacrificial layer to surround the column portion.

A portion of the first sacrificial layer may be disposed in an insertion groove of the second sacrificial layer.

The forming the first and second sacrificial layers on the substrate may include forming the first sacrificial layer including a first groove having an inclined contour and a second groove disposed in an intermediate portion of the first groove, and forming the second sacrificial layer in the first and second grooves.

The column portion may be formed by etching a portion of the second sacrificial layer.

The forming the first and second sacrificial layers on the substrate may include forming a protrusion portion of the first sacrificial layer, forming the second sacrificial layer to cover the protrusion portion, forming the column portion in which the protrusion portion is disposed, and an insertion groove in the second sacrificial layer, and forming the first sacrificial layer around the column portion and in the insertion groove.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
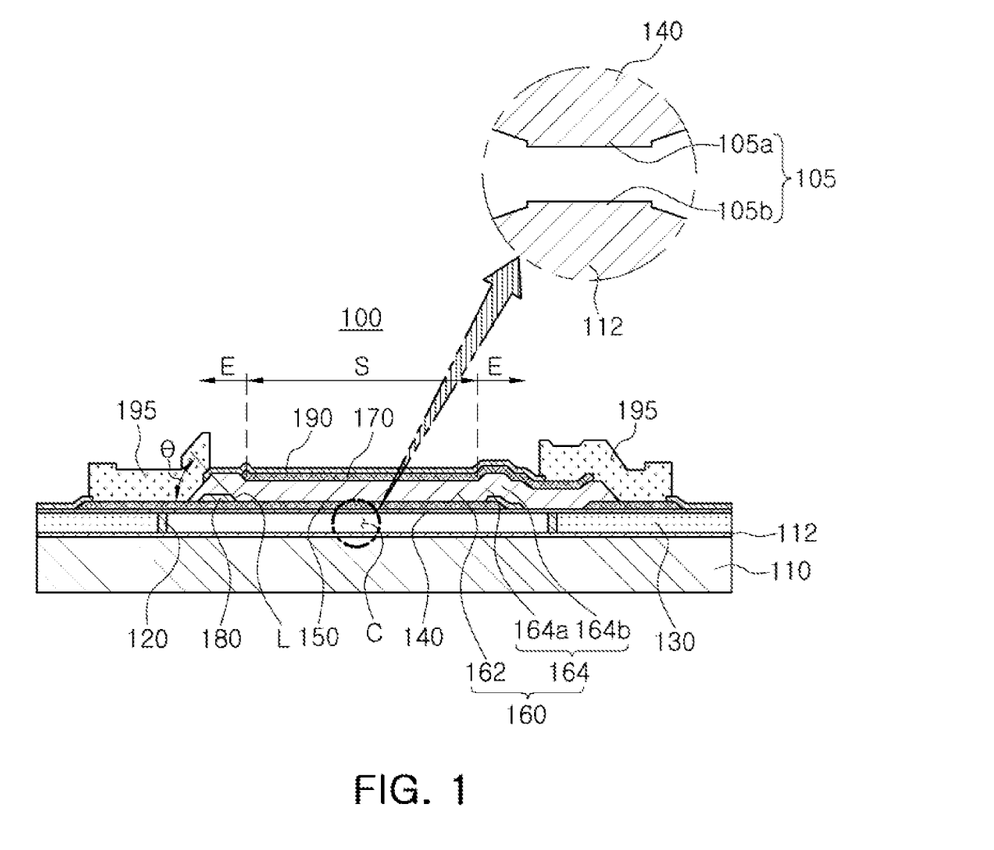
FIG. 1 is a schematic cross-sectional view illustrating an example of a bulk-acoustic wave resonator.

FIG. 1 is a schematic cross-sectional view illustrating an example of a bulk-acoustic wave resonator.

Referring to FIG. 1, a bulk-acoustic wave resonator 100 may include a substrate 110, a first layer 120, a second layer 130, a membrane layer 140, a lower electrode 150, a piezoelectric layer 160, an upper electrode 170, an insertion layer 180, a passivation layer 190, and a metal pad 195, as an example.

The substrate 110 may be a substrate on which silicon is stacked. For example, as the substrate 110, a silicon wafer may be used. The substrate 110 may include at least a substrate protection layer 112 disposed beneath a cavity C.

The substrate protection layer 112 may serve to prevent damage to the substrate 110 disposed beneath the substrate protection layer 112, when the cavity C is formed.

The substrate protection layer 112 may be formed of a dielectric layer containing any one of silicon nitride ($Si_3N_4$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer containing any one of aluminum (Al), nickel (Ni), chromium (Cr), platinum (Pt), gallium (Ga), and hafnium (Hf), and may be formed by any one or any combination of any two or more of a chemical vapor deposition process, a RF magnetron sputtering process, and an evaporation process.

The substrate protection layer 112 may include a protrusion 105 disposed in the cavity C. The protrusion 105 may be formed by a column portion 132 (see FIG. 5) of the second layer 130 to be described later. For example, when a portion of the first layer 120 is removed, the substrate protection layer 112 formed of a silicon nitride ($Si_3N_4$) material or a material containing silicon nitride ($Si_3N_4$) may be finely etched by an etching gas or an etching solution, as an example. For example, an inclined surface may be formed by finely etching the substrate protection layer 112 with an etching gas or an etching solution for etching the first layer 120, except for a region in which the column portion 132 is formed. Subsequently, the substrate protection layer 112 may be finely etched again with an etching gas or an etching solution for removing the column portion 132 of the second layer 130. For example, when a portion of the second layer 130 is removed, the substrate protection layer 112 formed of a silicon nitride ($Si_3N_4$) material or a material containing silicon nitride ($Si_3N_4$) may be finely etched by an etching gas or an etching solution. Therefore, after removing the column portion 132, the protrusion 105 may be formed in the substrate protection layer 112 by the column portion 132.

The first layer 120 may be formed on the substrate protection layer 112, and a cavity C may be disposed inside of the first layer 120. Meanwhile, the first layer 120 may be formed of a material to be removed by an etching solution or an etching gas containing hydrogen fluoride (HF) among halide-based etching solutions or etching gases, for example, a material containing an oxide, such as silicon dioxide ($SiO_2$).

The second layer 130 may be formed on the substrate 110 to be disposed outside of the first layer 120. For example, the second layer 130 may be disposed to surround the first layer 120.

The second layer 130 may be formed of a material to be removed by an etching solution or an etching gas containing xenon difluoride ($XeF_2$) among halide-based etching solutions or etching gases, for example, a material containing a polysilicon. The second layer 130, through a column portion 132 (see FIG. 5), may prevent the membrane layer 140 and the substrate 110 from being bonded to each other during the manufacturing process. For example, the second layer 130 may include a column portion 132, and the column portion 132 may support the membrane layer 140 in a central portion of the cavity C. Therefore, the need to overcome stiction between the membrane layer 140 and the substrate 110, which may occur in a trimming process of the passivation layer 190, may be prevented.

The present example provides that the first layer 120 is formed of a material containing an oxide, such as silicon dioxide ($SiO_2$), and the second layer 130 is formed of a material containing a polysilicon, as an example. The present disclosure is not limited thereto. The first layer 120 may be formed of a material containing a polysilicon, and the second layer 130 may be formed of a material containing an oxide, such as silicon dioxide ($SiO_2$), as an example.

The membrane layer 140 may form the cavity C together with the substrate 110 and the first layer 120. In addition, the membrane layer 140 may be formed of a material having a low reactivity with the etching solution or etching gas, when the first and second layers 120 and 130 are removed. As an example, the membrane layer 140 may be formed of a dielectric layer containing any one of silicon nitride ($Si_3N_4$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer containing any one of aluminum (Al), nickel (Ni), chromium (Cr), platinum (Pt), gallium (Ga), and hafnium (Hf).

A seed layer (not illustrated) formed of aluminum nitride (AlN) may be formed on the membrane layer 140. For example, the seed layer may be disposed between the membrane layer 140 and the lower electrode 150. The seed layer may be formed using a dielectric or a metal having an HCP crystal structure in addition to aluminum nitride (AlN). As an example, when the seed layer is a metal, the seed layer may be formed of titanium (Ti).

The membrane layer 140 may also be provided with a protrusion 105 disposed in the cavity C. The protrusion 105 may be formed by the column portion 132 (see FIG. 5) of the second layer 130 to be further described later. For example, when a portion of the first layer 120 is removed, the membrane 140 formed of a silicon nitride ($Si_3N_4$) material or a material containing silicon nitride ($Si_3N_4$) may be finely etched by an etching gas or an etching solution, as an example. For example, an inclined surface may be formed by finely etching the membrane layer 140 with an etching gas or an etching solution for etching the first layer 120, except for a region in which the column portions 132 are formed. Subsequently, the membrane layer 140 formed of a silicon nitride ($Si_3N_4$) material or a material containing silicon nitride ($Si_3N_4$) may be finely etched by an etching gas or an etching solution for removing the column portion 132 of the second layer 130. Therefore, after removing the column portion 132, the protrusion 105 may be formed in the membrane layer 140 by the column portion 132.

Referring to the protrusion 105, a first protrusion portion 105a formed on the substrate protection layer 112, and a second protrusion portion 105b formed on the membrane layer 140 to be opposite to the first protrusion portion 105a, may be provided, respectively. The first and second protrusion portions 105a and 105b may be variously shaped and sized depending on a shape of the column portion 132, as an example.

As described above, the protrusion 105 may be formed in the substrate protection layer 112 and the membrane layer 140 by removing a portion of the first and second layers 120 and 130 with different etching solutions or etching gases, respectively.

A difference in thickness (thickness deviation) between a portion in which the first protrusion portion 105a is formed in the substrate protection layer 112, and a portion in which an etching is most generated by the etching solution or the etching gas in the substrate protection layer 112 may be 0 to 500 Å, as an example. A difference in thickness (thickness deviation) between a portion in which the second protrusion portion 105b is formed in the membrane layer 140, and a portion in which an etching is most generated by the etching solution or the etching gas in the membrane layer 140 may also be 0 to 500 Å, as an example.

The lower electrode 150 may be formed on the membrane layer 140, and a portion thereof may be disposed on an upper portion of the cavity C. In addition, the lower electrode 150 may be used as either an input electrode or an output electrode for inputting and outputting an electrical signal such as a radio frequency (RF) signal, and the like.

The lower electrode 150 may be formed using a conductive material such as molybdenum (Mo), or an alloy thereof. The present disclosure is not limited thereto, and the lower electrode 150 may be formed of a conductive material such as ruthenium (Ru), tungsten (W), iridium (Ir), platinum (Pt), copper (Cu), titanium (Ti), tantalum (Ta), nickel (Ni), chromium (Cr), aluminum (Al), and the like, or an alloy thereof.

The piezoelectric layer 160 may be formed to cover at least a portion of the lower electrode 150 disposed in a position above the cavity C. The piezoelectric layer 160 may be a portion causing a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, when the piezoelectric layer 160 is formed of aluminum nitride (AlN), the piezoelectric layer 160 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included.

The piezoelectric layer 160 may include a piezoelectric portion 162 disposed in a flat portion S, and a bent portion 164 disposed in an extension portion E.

The piezoelectric portion 162 may be a portion directly stacked on the upper surface of the lower electrode 150. Therefore, the piezoelectric portion 162 may be disposed between the lower electrode 150 and the upper electrode 170, and may be formed in a flat shape, together with the lower electrode 150 and the upper electrode 170.

The bent portion 164 may be defined as a portion extending in an outward direction from the piezoelectric portion 162, and may be located in the extension portion E.

The bent portion 164 may be disposed on the insertion layer 180 to be described later, and may be formed to conform to the contour of the insertion layer 180. The piezoelectric layer 160 may be bent at the boundary between the piezoelectric portion 162 and the bent portion 164, and the bent portion 164 may conform correspondingly to a thickness and a contour of the insertion layer 180.

The bent portion 164 may be divided into an inclined portion 164a and an extended portion 164b.

The inclined portion 164a refers to a portion formed to be inclined along an inclined surface L of the insertion layer 180 to be described later. The extended portion 164b refers to a portion extending in an outward direction from the inclined portion 164a.

The inclined portion 164a may be formed parallel to the inclined surface L of the insertion layer 180, and an inclination angle of the inclined portion 164a may be formed to be equal to an inclination angle θ of the inclined surface L of the insertion layer 180.

The upper electrode 170 may be formed to cover at least a portion of the piezoelectric layer 160 disposed in a position above the cavity C. The upper electrode 170 may be used as either an input electrode or an output electrode for inputting and outputting an electrical signal such as a radio frequency (RF) signal, and the like. For example, when the lower electrode 150 is used as an input electrode, the upper electrode 170 may be used as an output electrode, and when the lower electrode 150 is used as an output electrode, the upper electrode 170 may be used as an input electrode.

The upper electrode 170 may be formed using a conductive material such as molybdenum (Mo), or an alloy thereof. The present disclosure is not limited thereto, and the upper electrode 170 may be formed of a conductive material such as ruthenium (Ru), tungsten (W), iridium (Ir), platinum (Pt), copper (Cu), titanium (Ti), tantalum (Ta), nickel (Ni), chromium (Cr), aluminum (Al), and the like, or an alloy thereof.

The resonance portion refers to a portion including the lower electrode 150, the piezoelectric layer 160, and the upper electrode 170, and refers to a configuration that serves to resonate energy at a specific frequency.

The insertion layer 180 may be disposed between the lower electrode 150 and the piezoelectric layer 160. The insertion layer 180 may be formed of a dielectric, such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), but may be formed of a material different from those of the piezoelectric layer 160. In addition, a region in which the insertion layer 180 is provided may be formed as an air if necessary. This may be accomplished by removing the insertion layer 180 during the manufacturing process.

In this example, a thickness of the insertion layer 180 may be the same as or similar to a thickness of the lower electrode 150. The insertion layer 180 may be formed to be thinner than the piezoelectric layer 160, or may be formed to similar to the piezoelectric layer 160. For example, the insertion layer 180 may be formed to have a thickness of 100 Å or more, and may be formed to be thinner than a thickness of the piezoelectric layer 160. The configuration of the present disclosure is not limited thereto.

The insertion layer 180 may be disposed along a surface formed by the membrane layer 140, the lower electrode 150, and an etching prevention portion 130.

The insertion layer 180 may be disposed around the flat portion S to support the bent portion 164 of the piezoelectric layer 160. Therefore, the bent portion 164 of the piezoelectric layer 160 may be divided into the inclined portion 164a and the extended portion 164b, depending on a shape of the insertion layer 180.

The insertion layer 180 may be disposed in a region other than the flat portion S. For example, the insertion layer 180 may be disposed over the entire region except the flat portion S, or may be disposed in a partial area.

At least a portion of the insertion layer 180 may be disposed between the piezoelectric layer 160 and the lower electrode 150.

A side surface of the insertion layer 180 disposed along the boundary of the flat portion S may be formed in a thicker form, as a distance from the flat portion S increases. The insertion layer 180 may be formed of an inclined surface L such that a side surface to be disposed adjacent to the flat portion S has a constant inclination angle θ.

When the inclination angle θ of the side surface of the insertion layer 180 is less than 5 degrees, a thickness of the insertion layer 180 should be made very thin or a region of the inclined surface L should be excessively large, to manufacture the insertion layer 180. Therefore, it may be difficult to be substantially realized.

In addition, when the inclination angle θ of the side surface of the insertion layer 180 is formed wider than 70 degrees, an inclination angle of the inclined portion 164a of the piezoelectric layer 160 stacked on the insertion layer 180 may be formed to be wider than 70 degrees. In this case, since the piezoelectric layer 160 may be excessively bent, a crack may occur in the bent portion of the piezoelectric layer 160.

The passivation layer 190 may be formed in a region except for a portion of the lower electrode 150 and the upper electrode 170. Meanwhile, the passivation layer 190 may prevent damage of the upper electrode 170 and the lower electrode 150 during the manufacturing process.

Furthermore, the thickness of the passivation layer 190 may be adjusted by etching for frequency control in the final process. The passivation layer 190 may be formed of the same material as that used for the membrane layer 140. For example, a dielectric layer containing any one of silicon oxide ($SiO_2$), silicon nitride ($Si_3N_4$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used.

The metal pad 195 may be formed on a portion of the lower electrode 150 and the upper electrode 170 in which the passivation layer 190 is not formed. As an example, the metal pad 195 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

As described above, the first and second layers 120 and 130 removed by different etching solutions or etching gases may prevent the resonance portion disposed on the cavity C from sticking to the substrate 110. For example, a central portion of the resonance portion may be supported through the column portion of the second layer 130, and the column portion may finally be removed, to prevent the resonance portion and the substrate 110 from sticking together during the trimming process of the passivation layer 190.

FIGS. 2 to 6 are process flow diagrams illustrating an example of a method of manufacturing a bulk-acoustic wave resonator according to an example of the present disclosure.

Figure 2:
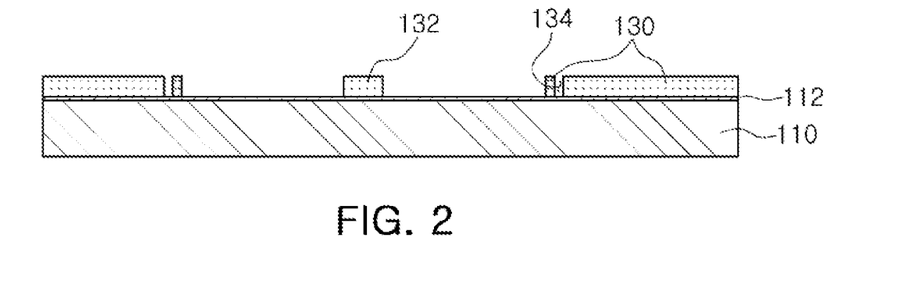
FIGS. 2 to 6 are process flow diagrams illustrating an example of a method of manufacturing a bulk-acoustic wave resonator.

First, as illustrated in FIG. 2, a second layer 130 may be formed on a substrate protection layer 112 of a substrate 110. The second layer 130 has a column portion 132 disposed in a central or an intermediate portion of a cavity C (see FIG. 1). Also, an insertion groove 134 into which the first layer 120 (see FIG. 3) is inserted, may be formed in the second layer 130.

Figure 3:
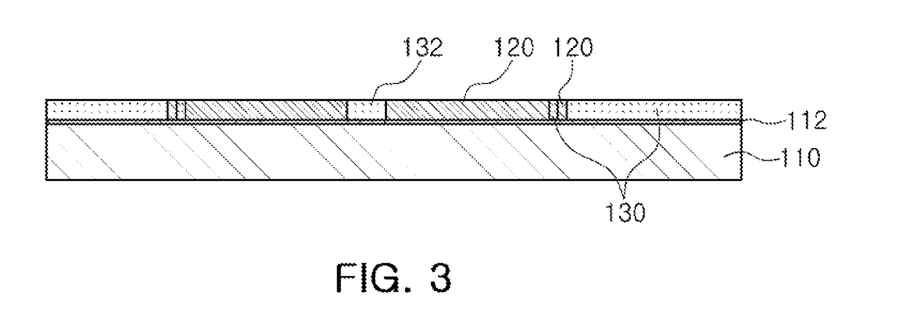

Then, as illustrated in FIG. 3, a first layer 120 may be formed to be disposed inside of the second layer 130. For example, a first layer 120 may be formed to fill the cavity C of the second layer 130 and the insertion groove 134.

Figure 4:
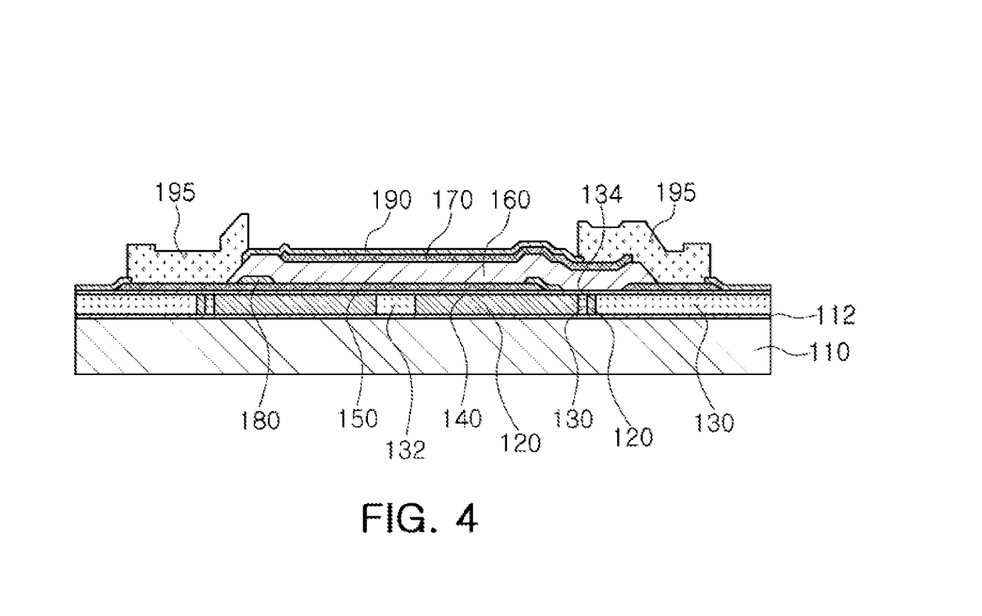

Then, as illustrated in FIG. 4, a membrane layer 140, a lower electrode 150, a piezoelectric layer 160, an upper electrode 170, an insertion layer 180, an upper electrode 170, a passivation layer 190, and a metal pad 195 may be formed on the first and second layers 120 and 130.

Figure 5:
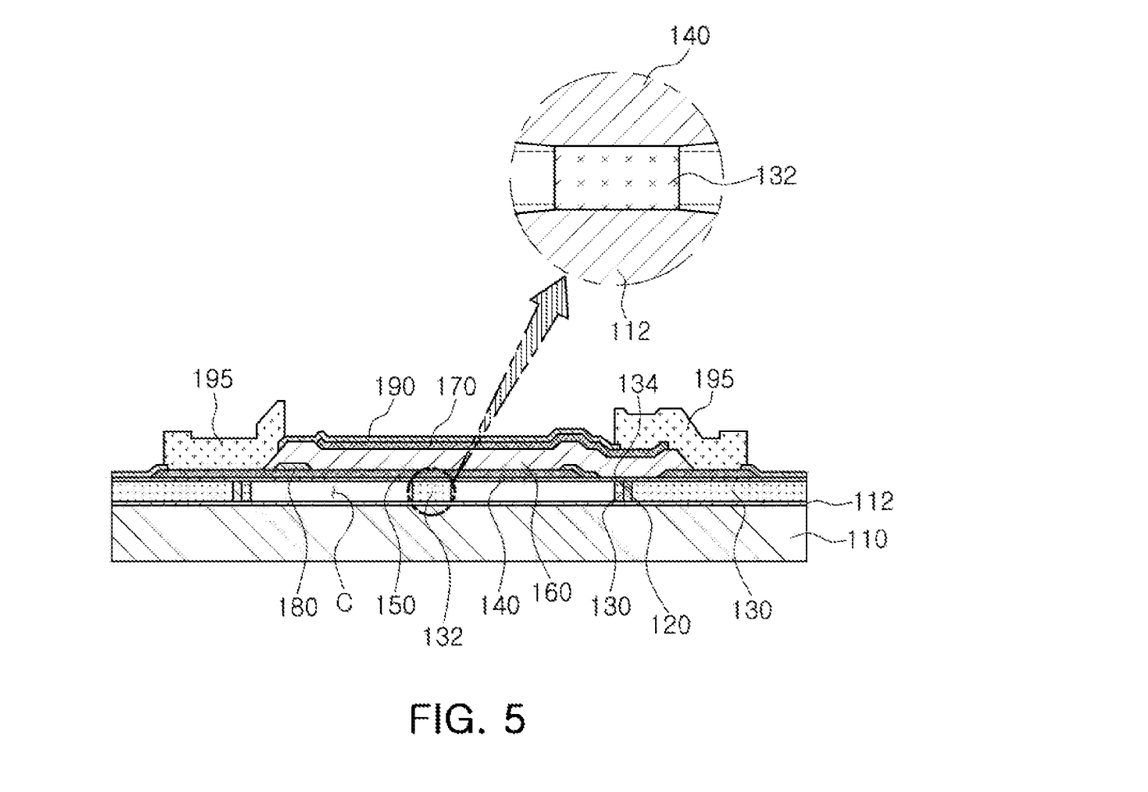

Thereafter, as illustrated in FIG. 5, a portion of the first layer 120 may be removed. For example, the first layer 120 disposed under the resonance portion, except for the first layer 120 disposed in the insertion groove 134 of the second layer 130 and the column portion 132 of the second layer 130 120, may be removed. At this time, the first layer 120 disposed in the insertion groove 134 of the second layer 130 may not be removed by the second layer 130 surrounding the cavity C.

Then, the first layer 120 may be removed by an etching solution or an etching gas containing hydrogen fluoride (HF). At this time, the substrate protection layer 112 and the membrane layer 140 formed of a silicon nitride ($Si_3N_4$) material or a material containing silicon nitride ($Si_3N_4$) may be finely etched, for example, by an etching solution or an etching gas. For example, an inclined surface may be formed by finely etching the substrate protection layer 112 and the membrane layer 140 with an etching gas or an etching solution for etching the first layer 120, except for a region in which the column portion 132 is formed.

Although not illustrated in the drawing, a trimming process of the passivation layer 190 may be performed. For example, an etching process of the passivation layer 190 may be performed for frequency correction.

Figure 6:
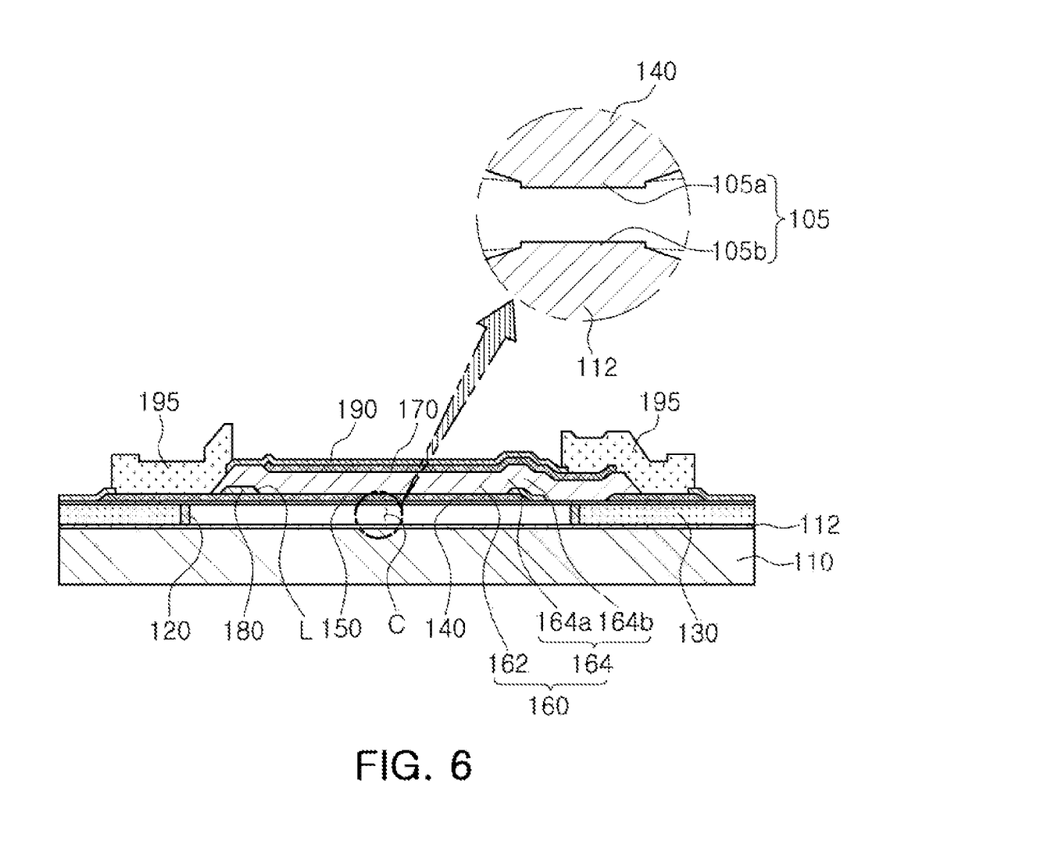

Finally, as illustrated in FIG. 6, the column portion 132 of the second layer 130, and the portion of the second layer 130 disposed inside of the first layer 120 may be removed. At this time, the column portion 132 of the second layer 130, and the portion of the second layer 130 disposed inside of the first layer 120 may be removed by an etching solution or an etching gas containing xenon difluoride ($XeF_2$) among halide-based etching solutions or etching gases.

The second layer 130 disposed outside of the first layer 120 may not be removed by the first layer 120.

At this time, the substrate protection layer 112 and the membrane layer 140 may finely be etched again by the etching solution or the etching gas for removing the column portion 132 of the second layer 130. The protrusion 105 may be formed in the substrate protection layer 112 and the membrane layer 140 by the column portions 132, after removing the column portions 132.

A difference in thickness (thickness deviation) between a portion in which the first protrusion portion 105a is formed in the substrate protection layer 112, and a portion in which an etching is most generated by the etching solution or the etching gas in the substrate protection layer 112 may be 0 to 500 Å, as an example. A difference in thickness (thickness deviation) between a portion in which the second protrusion portion 105b is formed in the membrane layer 140, and a portion in which an etching is most generated by the etching solution or the etching gas in the membrane layer 140 may also be 0 to 500 A, as an example.

As described above, the first and second layers 120 and 130 removed by different etching solutions or etching gases may prevent the resonance portion disposed on the cavity C from sticking to the substrate 110. For example, a central portion of the resonance portion may be supported through the column portion of the second layer 130, and the column portion may finally be removed, to prevent the resonance portion and the substrate 110 from sticking together during the manufacturing process through the column portion 132 of the second layer 130.

Figure 7:
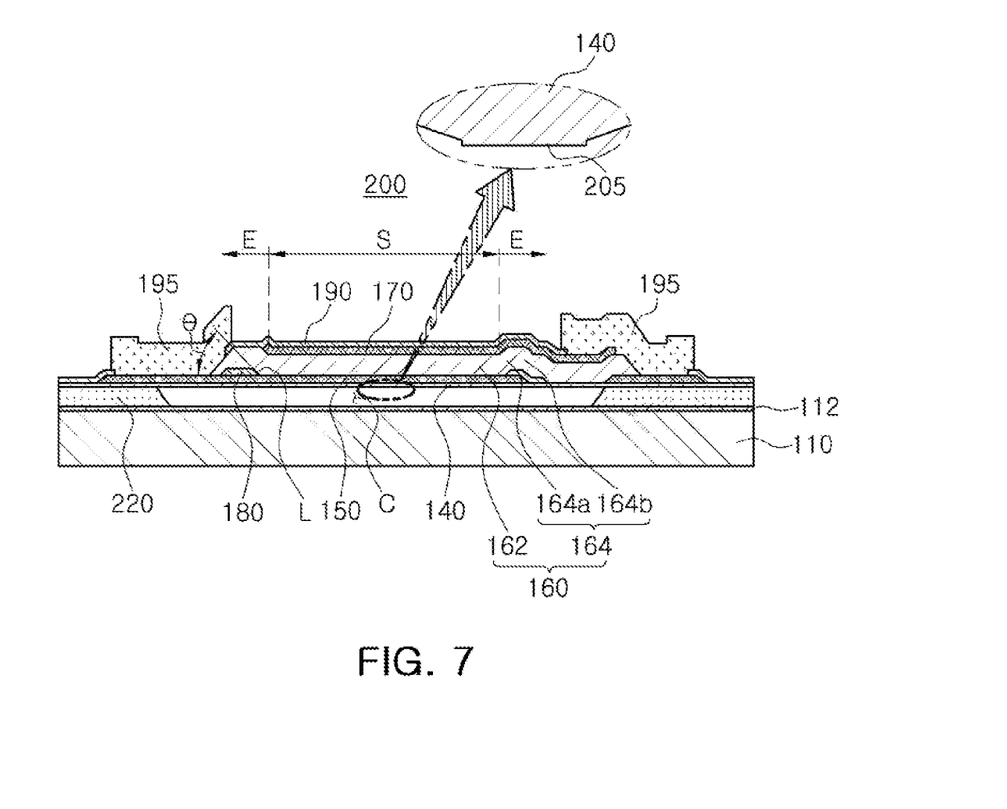
FIG. 7 is a schematic cross-sectional view illustrating an example of a bulk-acoustic wave resonator.

FIG. 7 is a schematic cross-sectional view illustrating an example of a bulk-acoustic wave resonator.

Referring to FIG. 7, a bulk-acoustic wave resonator 200 according to an example of the present disclosure may include a substrate 110, a first layer 220, a membrane layer 140, a lower electrode 150, a piezoelectric layer 160, an upper electrode 170, an insertion layer 180, a passivation layer 190, and a metal pad 195, as an example.

Since the substrate 110, the membrane layer 140, the lower electrode 150, the piezoelectric layer 160, the upper electrode 170, the insertion layer 180, the passivation layer 190, and the metal pad 195 may be the same elements as those described above, they may be replaced with the above description, and a detailed description thereof will be omitted, hereinafter.

The first layer 220 may form a cavity C with the substrate 110 and the membrane layer 140. For example, the first layer 220 may be disposed to surround the cavity C. Meanwhile, the first layer 220 may be formed of a material to be removed by an etching solution or an etching gas containing xenon difluoride ($XeF_2$) among halide-based etching solutions or etching gases, for example, a material containing a polysilicon.

Meanwhile, although not illustrated in the drawing, a second layer 230 (see FIGS. 9 to 10) may be formed in the cavity C during the manufacturing process. Thereafter, the second layer 230 may be removed in the final process to be not present in the cavity C, as illustrated in FIG. 7.

For example, the second layer 230 may be formed of a material to be removed by an etching solution or an etching gas containing hydrogen fluoride (HF) among halide-based etching solutions or etching gases, for example, a material containing an oxide, such as silicon dioxide ($SiO_2$).

The present example provides that the first layer 220 is formed of a material containing an oxide, such as silicon dioxide ($SiO_2$), and the second layer 230 is formed of a material containing a polysilicon, as an example. The present disclosure is not limited thereto. The first layer 220 may be formed of a material containing a polysilicon, and the second layer 230 may be formed of a material containing an oxide, such as silicon dioxide ($SiO_2$).

A protrusion 205 may be formed on a lower surface of the membrane layer 140. The protrusion 205 may be formed by a column portion 232 (see FIG. 10) of the second layer 230 to be described later. For example, when the first layer 220 is partially removed, the membrane later 140 may be etched finely by the etching solution or the etching gas. For example, an inclined surface may be formed by finely etching the membrane later 140 with an etching gas or an etching solution for etching the first layer 220, except for a region in which the column portion 232 is formed.

Thereafter, the membrane layer 140 may be finely etched again by an etching solution or an etching gas for removing the column portions 232 of the second layer 230. Therefore, after removing the column portion 232, the protrusion 205 may be formed in the membrane layer 140.

Meanwhile, a difference in thickness (thickness deviation) between a portion in which the protrusion 205 is formed in the membrane layer 140, and a portion in which an etching is most generated by the etching solution or the etching gas in the membrane layer 140 may be 0 to 500 Å.

As described above, the first and second layers 220 and 230 removed by different etching solutions or etching gases may prevent the resonance portion disposed on the cavity C from sticking to the substrate 110. For example, a central portion of the resonance portion may be supported through the column portion of the second layer 230, and the column portion may finally be removed, to prevent the resonance portion and the substrate 110 from sticking together during the manufacturing process through the second layer 230.

FIGS. 8 to 11 are process flow diagrams illustrating a method of manufacturing a bulk-acoustic wave resonator according to an example of the present disclosure.

Figure 8:
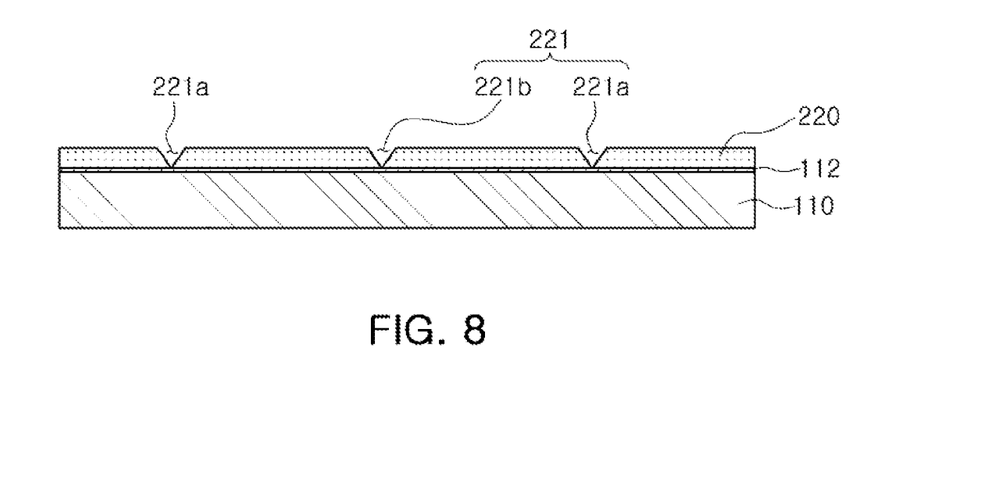
FIGS. 8 to 11 are process flow diagrams illustrating an example of a method of manufacturing a bulk-acoustic wave resonator.

As illustrated in FIG. 8, a first layer 220 may be stacked on a substrate protection layer 112 of a substrate 110, and a groove 221 may be formed in a first layer 220. The groove 221 may include a first groove 221a having an inclined contour, and a second groove 221b disposed in a central portion of the first groove 221a. The first layer 220 may be formed of a material to be removed by an etching solution or an etching gas containing xenon difluoride ($XeF_2$) among halide-based etching solutions or etching gases, for example, a material containing a polysilicon.

Figure 9:
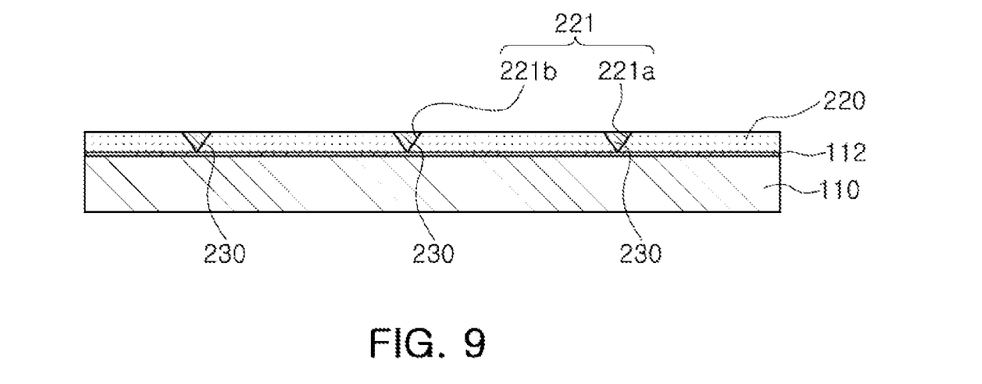

Then, as illustrated in FIG. 9, a second layer 230 may be formed in first and second grooves 221a and 221b of a first layer 220. The second layer 230 may be formed of a material to be removed by an etching solution or an etching gas containing hydrogen fluoride (HF) among halide-based etching solutions or etching gases, for example, a material containing an oxide, such as silicon dioxide ($SiO_2$). Further, the second layer 230 may include a column portion 232 for supporting the resonance portion, and an etching prevention portion 234 for preventing etching of the first layer 220, disposed outside of the second layer 230.

The present example provides that the first layer 220 is formed of a material containing an oxide, such as silicon dioxide ($SiO_2$), and the second layer 230 is formed of a material containing a polysilicon, as an example. The present disclosure is not limited thereto. The first layer 220 may be formed of a material containing an oxide, such as silicon dioxide ($SiO_2$), and the second layer 230 may be formed of a material containing a polysilicon.

Figure 10:
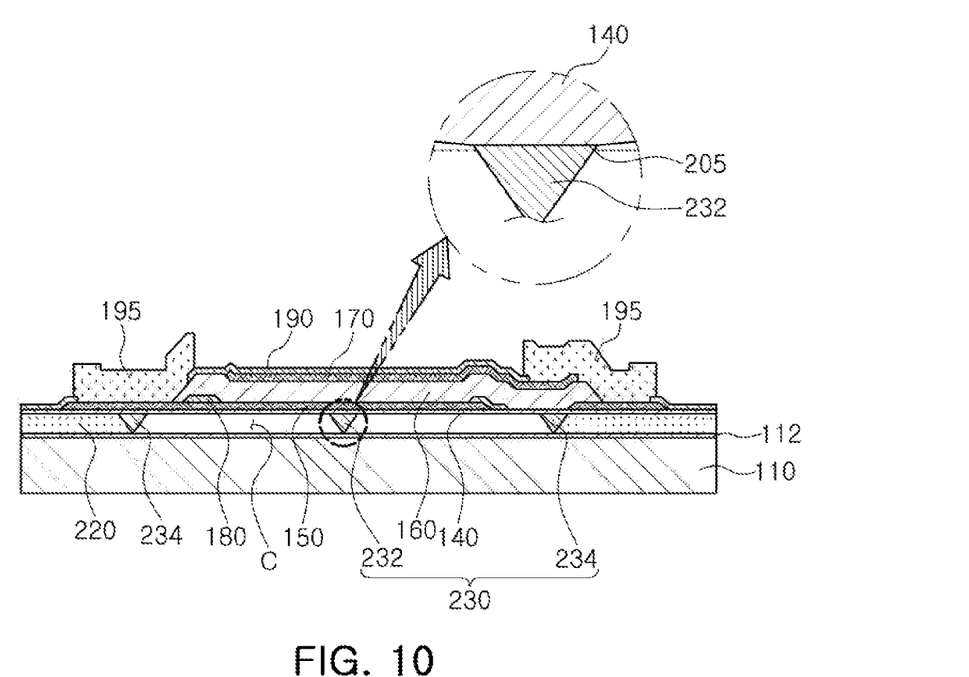

Thereafter, as illustrated in FIG. 10, a membrane layer 140, a lower electrode 150, a piezoelectric layer 160, an upper electrode 170, an insertion layer 180, a passivation layer 190, and a metal pad 195 may be formed on the first and second layers 220 and 230. Further, a portion of a first layer 220 may be removed. For example, the first layer 220 disposed inside of a second layer 230, e.g., in a position lower than a position of the resonance portion, may be removed. At this time, the first layer 220 disposed outside of the second layer 230 may not be removed by the second layer 230.

Then, the first layer 220 may be removed by an etching solution or an etching gas containing xenon difluoride ($XeF_2$) among halide-based etching solutions or etching gases.

A protrusion 205 may be formed on a lower surface of the membrane layer 140. The protrusion 205 may be formed by a column portion 232 (see FIG. 10) of the second layer 230 to be described later. For example, when the first layer 220 is partially removed, the substrate protection layer 112 may be etched finely by the etching solution or the etching gas. For example, an inclined surface may be formed by finely etching the substrate protection layer 112 with an etching gas or an etching solution for etching the first layer 220, except for a region in which the column portion 232 is formed.

Although not illustrated in the drawing, a trimming process of the passivation layer 190 may be performed. For example, an etching process of the passivation layer 190 may be performed for frequency correction.

Although not illustrated in the drawing, a trimming process of the passivation layer 190 may be performed. For example, an etching process of the passivation layer 180 may be performed for frequency correction.

Figure 11:
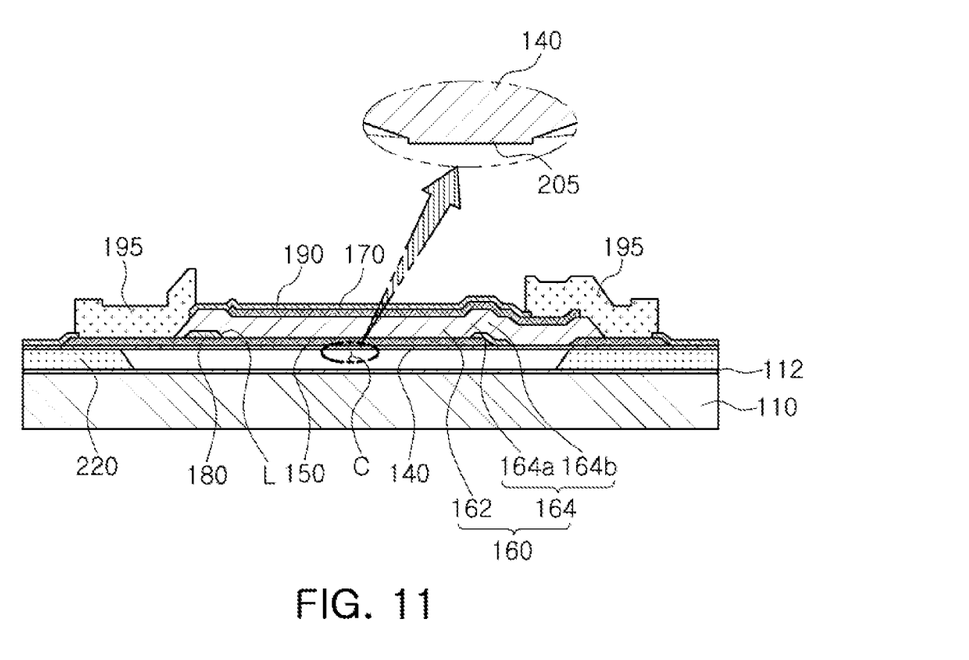

Thereafter, as illustrated in FIG. 11, the second layer 230 may be finally removed. At this time, the second layer 230 may be removed by an etching solution or an etching gas containing hydrogen fluoride (HF) among halide-based etching solutions or etching gases. At this time, the membrane layer 140 may be finely etched again by an etching solution or an etching gas for removing the column portions 232 of the second layer 230. Therefore, after removing the column portion 232, the protrusion 205 may be formed in the membrane layer 140.

Meanwhile, a difference in thickness (thickness deviation) between a portion in which the protrusion 205 is formed in the membrane layer 140, and a portion in which an etching is most generated by the etching solution or the etching gas in the membrane layer 140 may be 0 to 500 Å, as an example.

As described above, the first and second layers 220 and 230 removed by different etching solutions or etching gases may prevent the resonance portion disposed on the cavity C from sticking to the substrate 110. For example, a central portion of the resonance portion may be supported through the second layer 230, to prevent the resonance portion and the substrate 110 from sticking together during the manufacturing process through the second layer 230.

Figure 12:
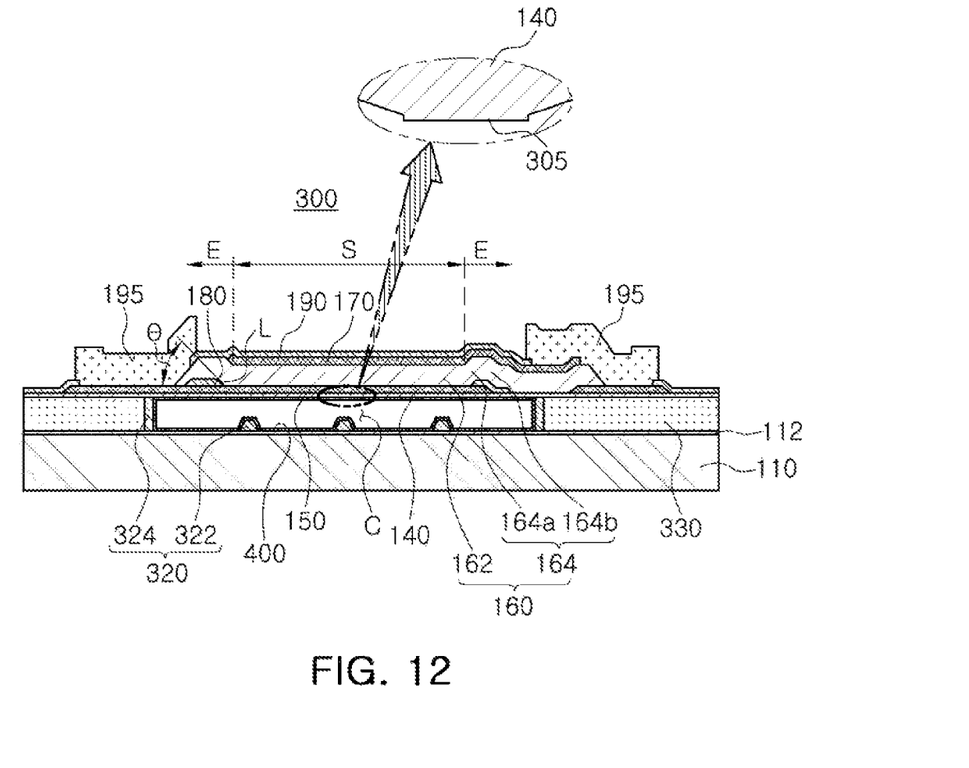
FIG. 12 is a schematic cross-sectional view illustrating an example of a bulk-acoustic wave resonator.

FIG. 12 is a schematic cross-sectional view illustrating a bulk-acoustic wave resonator according to an example of the present disclosure.

Referring to FIG. 12, a bulk-acoustic wave resonator 300 according to an example of the present disclosure may include a substrate 110, a first layer 320, a second layer 330, a membrane layer 140, a lower electrode 150, a piezoelectric layer 160, an upper electrode 170, an insertion layer 180, a passivation layer 190, a metal pad 195, and a coating layer 400, as an example.

The substrate 110, the membrane layer 140, the lower electrode 150, the piezoelectric layer 160, the upper electrode 170, the insertion layer 180, the passivation layer 190, and the metal pad 195 may be the same elements as those described above, they may be replaced with the above description, and a detailed description thereof will be omitted, hereinafter.

The first layer 320 may be formed on the substrate protection layer 112. Meanwhile, the first layer 320 may be formed of a material to be removed by an etching solution or an etching gas containing hydrogen fluoride (HF) among halide-based etching solutions or etching gases, for example, a material containing an oxide, such as silicon dioxide ($SiO_2$). The first layer 320 may include a protrusion portion 322 disposed in the cavity C, and an etching prevention portion 324 for preventing etching of the second layer 330.

The second layer 330 may be formed on the substrate 110 to be disposed outside of the first layer 320. For example, the second layer 330 may be disposed to surround the first layer 320. Meanwhile, the second layer 330 may be formed of a material to be removed by an etching solution or an etching gas containing xenon difluoride ($XeF_2$) among halide-based etching solutions or etching gases, for example, a material containing a polysilicon.

Although not illustrated in the drawing, the second layer 330 may be formed to cover the protrusion portion 322, and may have a column portion (not illustrated) for supporting the resonance portion during the manufacturing process. Further, the column portion may be removed during the manufacturing process.

Meanwhile, the present example provides that the first layer 320 is formed of a material containing an oxide, such as silicon dioxide ($SiO_2$), and the second layer 330 is formed of a material containing a polysilicon, as an example. The present disclosure is not limited thereto. The first layer 320 may be formed of a material containing a polysilicon, and the second layer 330 may be formed of a material containing an oxide, such as silicon dioxide ($SiO_2$).

A protrusion 305 may be formed on a lower surface of the membrane layer 140. The protrusion 305 may be formed by a column portion 332 (see FIG. 14) of the second layer 330 to be described later. For example, when the first layer 320 is partially removed, the membrane layer 140 may be etched finely by the etching solution or the etching gas. For example, an inclined surface may be formed by finely etching the membrane layer 140 with an etching gas or an etching solution for etching the first layer 320, except for a region in which the column portion 332 is formed.

Thereafter, the membrane layer 140 may be finely etched again by an etching solution or an etching gas for removing the column portions 332 of the second layer 330. Therefore, after removing the column portion 332, the protrusion 305 may be formed in the membrane layer 140.

Meanwhile, a difference in thickness (thickness deviation) between a portion in which the protrusion 305 is formed in the membrane layer 140, and a portion in which an etching is most generated by the etching solution or the etching gas in the membrane layer 140 may be 0 to 500 Å, as an example.

The coating layer 400 may be stacked inside of the cavity C, and may be formed of a water-repellent layer. The coating layer 400 may serve to further prevent the need to overcome stiction between the resonance portion and the substrate 110 together with the protrusion portion 322.

FIGS. 13 to 19 are process flow charts illustrating a method of manufacturing a bulk-acoustic wave resonator according to an example of the present disclosure.

Figure 13:
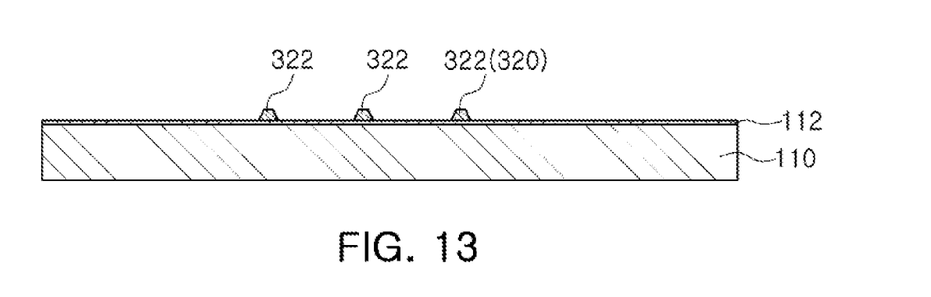
FIGS. 13 to 19 are process flow charts illustrating an example of a method of manufacturing a bulk-acoustic wave resonator.

As illustrated in FIG. 13, a portion of a first layer 320, e.g., a protrusion portion 322 of the first layer 320, may be formed on a substrate protection layer 112 of a substrate 110. The protrusion portion 322 may be formed of a material to be removed by an etching solution or an etching gas containing hydrogen fluoride (HF) among halide-based etching solutions or etching gases, for example, a material containing an oxide, such as silicon dioxide ($SiO_2$).

Figure 14:
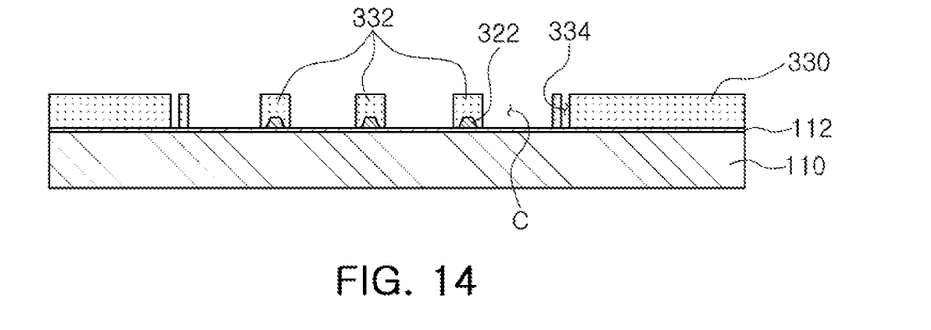

Thereafter, as illustrated in FIG. 14, a second layer 330 may be formed. For example, the column portion 332 of the second layer 330 may be formed to cover the protrusion portion 322 of the first layer 320. A cavity C, and an insertion groove 334 for forming the etching preventing portion 324 (see FIG. 15) of the first layer 320, may be formed in the second layer 330. Meanwhile, the second layer 330 may be formed of a material to be removed by an etching solution or an etching gas containing xenon difluoride ($XeF_2$) among halide-based etching solutions or etching gases, for example, a material containing a polysilicon.

Figure 15:
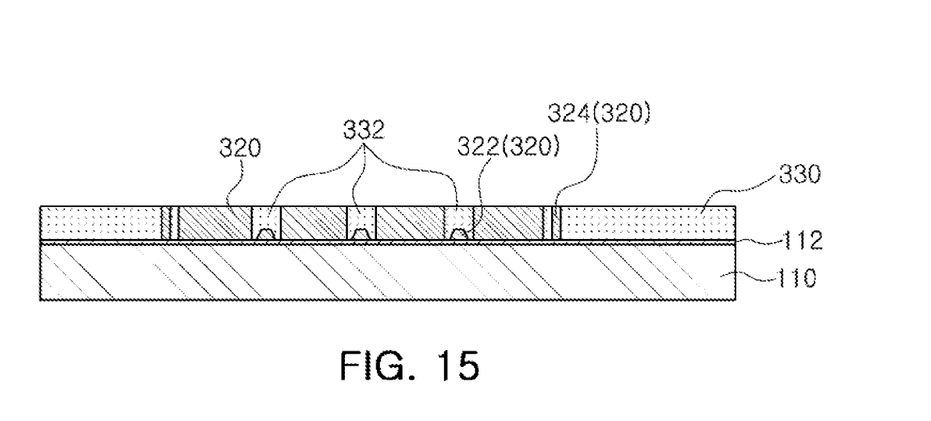

Then, as illustrated in FIG. 15, a first layer 320 may be formed on a substrate 110, except for a protrusion portion 322. For example, the first layer 320 may be formed to be disposed in a cavity C and an insertion groove 334. The first layer 320 may be formed of a material to be removed by an etching solution or an etching gas containing hydrogen fluoride (HF) among halide-based etching solutions or etching gases, for example, a material containing an oxide, such as silicon dioxide ($SiO_2$).

Figure 16:
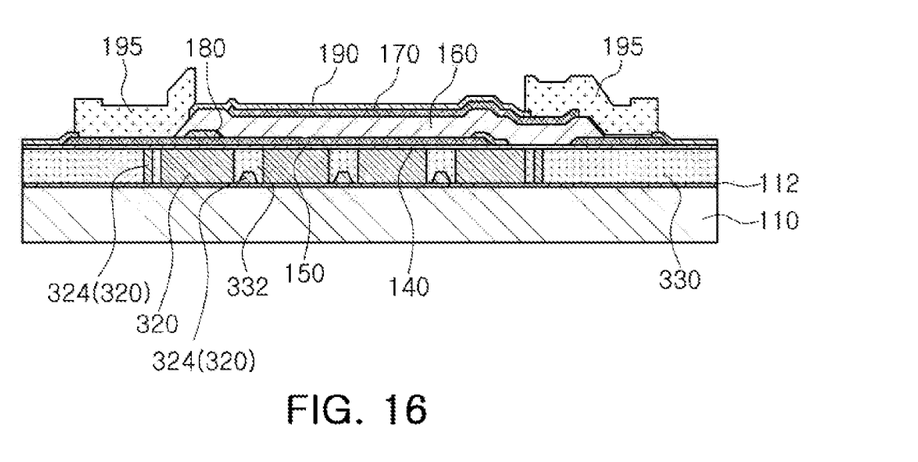

Thereafter, as illustrated in FIG. 16, a membrane layer 140, a lower electrode 150, a piezoelectric layer 160, an upper electrode 170, an insertion layer 180, a passivation layer 190, and a metal pad 195 may be formed on the first and second layers 220 and 230.

Figure 17:
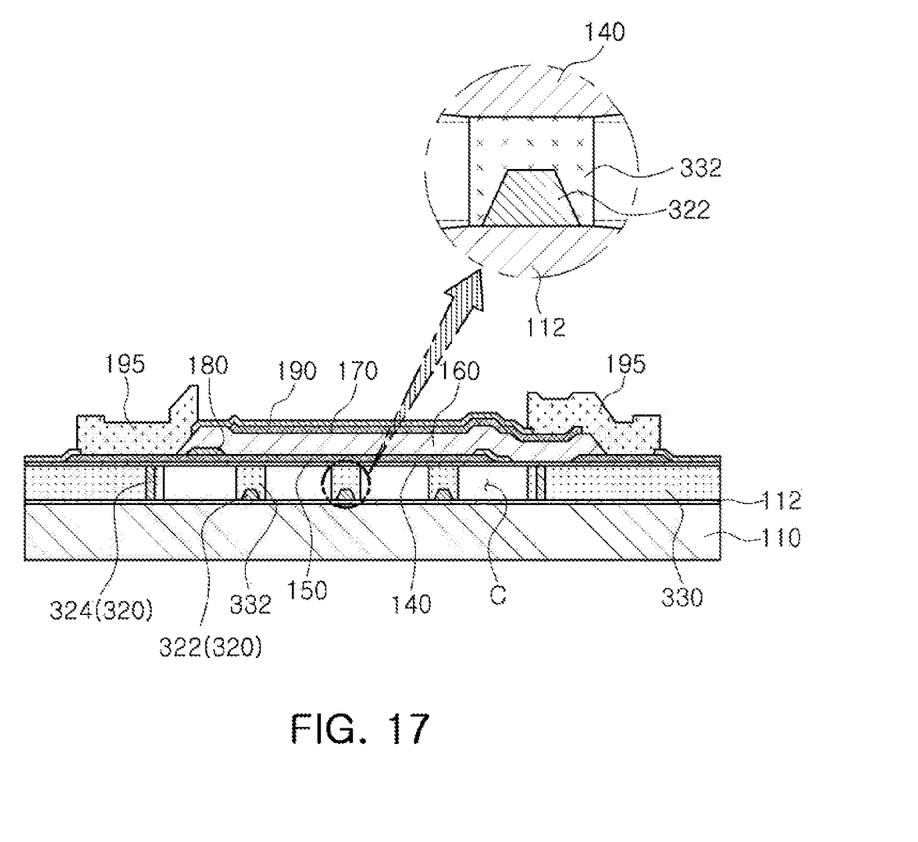

Then, as illustrated in FIG. 17, the first layer 320 surrounding the column portion 332 may be removed. At this time, the first layer 320 may be removed by an etching solution or an etching gas containing hydrogen fluoride (HF) among halide-based etching solutions or etching gases.

At this time, the membrane layer 140 may be etched finely by the etching solution or the etching gas. For example, an inclined surface may be formed by finely etching the membrane layer 140 with an etching gas or an etching solution for etching the first layer 320, except for a region in which the column portion 332 is formed.

Thereafter, although not illustrated in the drawing, a trimming process of the passivation layer 190 may be performed. For example, an etching process of the passivation layer 190 may be performed for frequency correction.

Figure 18:
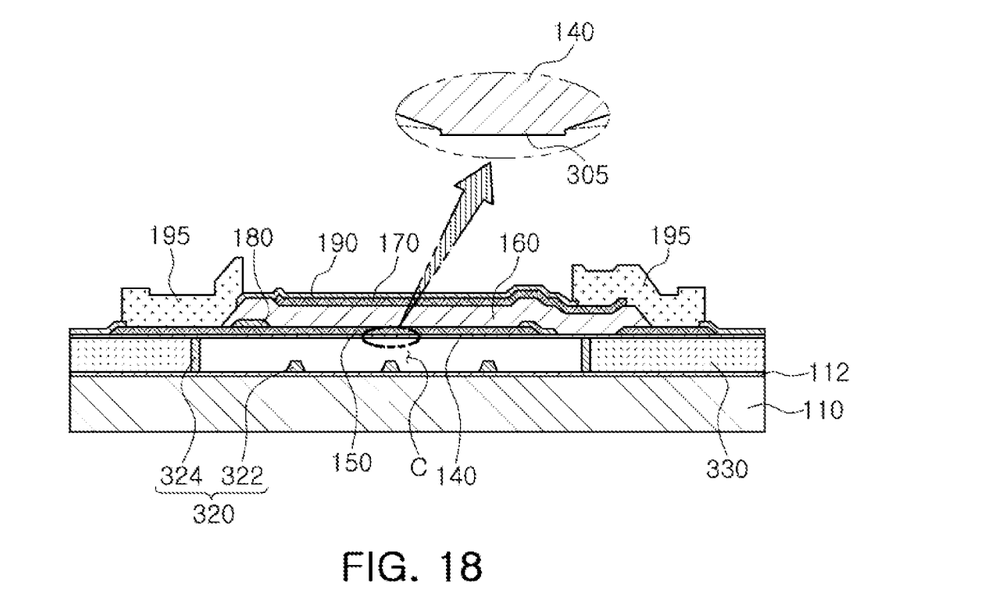

Then, as illustrated in FIG. 18, the second layer 330 disposed inside of the etching prevention portion 324 of the first layer 320 may be removed. For example, the column portion 332 formed to cover the protrusion portion 332, and the second layer 330 disposed inside of the etching prevention portion 324 may be removed.

At this time, the membrane layer 140 may finely be etched again by the etching solution or the etching gas for removing the column portion 332 of the second layer 330. Therefore, after the column portion 332 may be removed, the protrusion 305 may be formed in the membrane layer 140 by the column portion 332.

Figure 19:
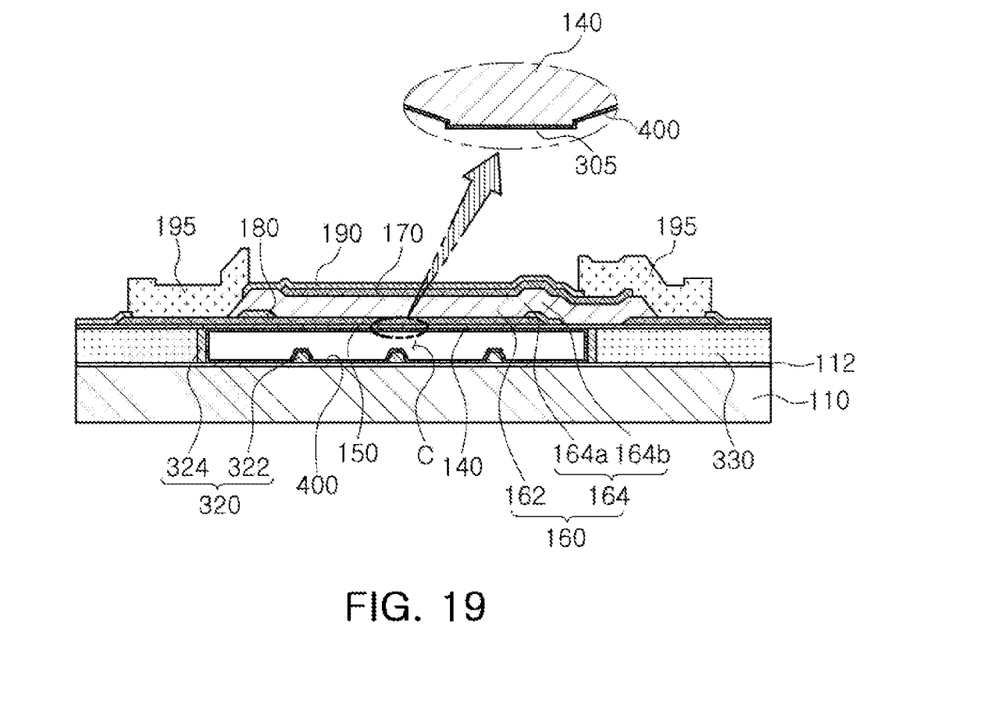

Thereafter, as illustrated in FIG. 19, a coating layer 400 may be formed in a cavity C.

According to an aspect of the present disclosure, the need to overcome stiction between the substrate and the resonance portion due to the deformation of the resonance portion may be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
a substrate including a substrate protection layer;
a first layer, disposed on the substrate protection layer, comprising an etching prevention portion;
a second layer disposed outside of the first layer;
a membrane layer forming a cavity with the substrate protection layer and the first layer; and
a resonance portion disposed on the membrane layer,
wherein either one or both of the substrate protection layer and the membrane layer comprises a protrusion disposed in the cavity, and
the etching prevention portion is disposed to surround the cavity.

2. The bulk-acoustic wave resonator according to claim 1, wherein the protrusion comprises a first protrusion portion formed on the substrate protection layer, and a second protrusion portion formed on the membrane layer to be opposite to the first protrusion portion.

3. The bulk-acoustic wave resonator according to claim 1, wherein the protrusion comprises a plurality of protrusions that are each disposed to be spaced apart from another.

4. The bulk-acoustic wave resonator according to claim 1, wherein the first layer is formed of a material comprising an oxide or polysilicon.

5. The bulk-acoustic wave resonator according to claim 1, wherein either one or both of the first layer and the second layer are formed of any one selected from materials including an oxide or polysilicon.

6. The bulk-acoustic wave resonator according to claim 1, wherein the first layer is formed of a material to be etched by any one selected from an etching solution or an etching gas containing hydrogen fluoride (HF), and an etching solution or an etching gas containing xenon difluoride (XeF2).

7. The bulk-acoustic wave resonator according to claim 1, wherein the first layer and the second layer are formed of a material to be selectively etched by any one selected from an etching solution or an etching gas containing hydrogen fluoride (HF), and an etching solution or an etching gas containing xenon difluoride (XeF2).

8. The bulk-acoustic wave resonator according to claim 1, wherein the substrate protection layer and the membrane layer are formed of a dielectric layer containing any one of silicon nitride (Si3N4), manganese oxide (MgO), zirconium oxide (ZrO2), aluminum nitride (AlN), lead zirconate titanate (PZT), gallium arsenide (GaAs), hafnium oxide (HfO2), aluminum oxide (Al2O3), titanium oxide (TiO2), and zinc oxide (ZnO), or a metal layer containing any one of aluminum (Al), nickel (N), chromium (Cr), platinum (Pt), gallium (Ga), and hafnium (Hf).

9. The bulk-acoustic wave resonator according to claim 1, wherein the first layer further comprises a protrusion portion disposed inside of the cavity.

10. The bulk-acoustic wave resonator according to claim 9, further comprising a coating layer formed in the cavity.

* * * * *